United States Patent [19]
Hattori

[11] Patent Number: 6,037,093
[45] Date of Patent: Mar. 14, 2000

[54] PHOTOSENSITIVE RECORDING MEDIUM

[75] Inventor: Yasuhiro Hattori, Nagoya, Japan

[73] Assignee: Brother Kogyo Kabushiki Kaisha, Nagoya, Japan

[21] Appl. No.: 09/033,167

[22] Filed: Mar. 2, 1998

[30] Foreign Application Priority Data

Mar. 11, 1997 [JP] Japan .................................. 9-056214

[51] Int. Cl.⁷ .................. G03C 8/10; G03C 8/44; G03C 8/26
[52] U.S. Cl. .................. 430/138; 430/211; 430/213
[58] Field of Search .................. 430/138, 211

[56] References Cited

U.S. PATENT DOCUMENTS

| | | | |
|---|---|---|---|
| 2,800,457 | 7/1957 | Green et al. | 252/316 |
| 2,800,458 | 7/1957 | Green et al. | 252/316 |
| 3,864,275 | 2/1975 | Kan et al. | 252/316 |
| 4,399,209 | 8/1983 | Sanders et al. | 430/138 |
| 4,440,846 | 4/1984 | Sanders et al. | 430/138 |
| 4,501,809 | 2/1985 | Hiraishi et al. | 430/138 |
| 4,766,050 | 8/1988 | Jerry | 430/211 |
| 4,865,938 | 9/1989 | Sakai et al. | 430/211 |
| 4,943,827 | 7/1990 | Good et al. | 355/30 |
| 4,945,024 | 7/1990 | Kovacs et al. | 430/138 |
| 4,948,695 | 8/1990 | Matsuhita et al. | |
| 5,013,629 | 5/1991 | Sekine et al. | 430/138 |
| 5,043,314 | 8/1991 | Suzuki et al. | 430/138 |
| 5,100,756 | 3/1992 | Kobayashi | 430/138 |
| 5,283,152 | 2/1994 | Feldman et al. | 430/211 |
| 5,296,331 | 3/1994 | Taguchi | 430/138 |
| 5,516,621 | 5/1996 | Tsuda et al. | 430/138 |

FOREIGN PATENT DOCUMENTS

| | | |
|---|---|---|
| 952 807 | 3/1964 | European Pat. Off. . |
| 965074 | 7/1964 | European Pat. Off. . |
| 39 14 493 A1 | 11/1989 | Germany . |
| 36-9168 | 6/1936 | Japan . |
| 38-19574 | 9/1938 | Japan . |
| 42-446 | 1/1942 | Japan . |
| 42-771 | 1/1942 | Japan . |
| 51-9079 | 3/1976 | Japan . |
| 58-17432 | 2/1983 | Japan . |
| 58-45090 | 3/1983 | Japan . |
| 58-88739 | 5/1983 | Japan . |
| 58-88740 | 5/1983 | Japan . |
| 64-63948 | 3/1989 | Japan . |
| 3-39747 | 2/1991 | Japan . |
| 3-77952 | 4/1991 | Japan . |
| B-5-39303 | 6/1993 | Japan . |
| 6-27626 | 2/1994 | Japan . |
| 6-48020 | 2/1994 | Japan . |
| 6-51501 | 2/1994 | Japan . |
| 6-51502 | 2/1994 | Japan . |
| 9-56214 | 3/1997 | Japan . |

*Primary Examiner*—Richard L. Schilling
*Attorney, Agent, or Firm*—Oliff & Berridge, PLC

[57] ABSTRACT

A photosensitive recording medium has a structure wherein, on a light-transmitting base material, a photosensitive layer containing color image-forming photosensitive microcapsules having as materials encapsulated therein a colorant and a photosensitive material is formed and, on the photosensitive layer, an image-receiving layer is formed. The image-receiving layer has a function to cover up the photosensitive microcapsules in the fresh photosensitive recording method and, upon release of the encapsulated materials from the photosensitive microcapsules, a function to absorb the encapsulated material to form an image. The photosensitive recording medium enables formation of full-color images on the photosensitive recording medium itself, and can achieve a low running cost and also be used even in small-sized image-forming apparatus.

18 Claims, 2 Drawing Sheets

PHOTOSENSITIVE RECORDING MEDIUM

BACKGROUND OF THE INVENTION

1. Field of the Invention

This invention relates to a photosensitive recording medium on which color images are recorded and formed by the action of light modulated in accordance with image information.

2. Description of the Related Art

Japanese Patent Application Laid-open No. 5-39303 discloses a conventional photosensitive recording medium coated with photosensitive microcapsules so that color images can be transferred and formed on plain paper.

This photosensitive recording medium comprises a base material such as paper or a resin film and a photosensitive layer coated on the base material, and the photosensitive layer is further coated with photosensitive microcapsules having as materials encapsulated therein a photosensitive material capable of hardening upon reaction with light and an image-forming material comprising a pigment or the like.

Thus, upon exposure of this photosensitive recording medium to light in accordance with image information, there occur some areas in which the photosensitive microcapsules have hardened and other areas in which they have not hardened. Thereafter, this medium and plain paper are brought into face-to-face contact, which are then, e.g., passed through a pair of pressure rollers so that an external force is applied to the microcapsules, whereupon the microcapsules having not hardened are collapsed but the microcapsules having hardened are not collapsed. Hence, from the microcapsules thus collapsed, the encapsulated materials comprising the image-forming material are released. Then, upon transfer of the encapsulated materials to the plain paper, images are formed on the plain paper.

However, the photosensitive recording medium disclosed in the above publication employs photosensitive microcapsules which are sensitive to light with a wavelength of the ultraviolet region, and hence, for writing, the medium must be exposed to ultraviolet light before images are recorded, resulting in a very low practical utility. Accordingly, the present applicants have made studies to bring out a visible-light photosensitive material capable of direct hardening upon exposure to visible light rays. As the outcome of such studies, Japanese Patent Application Laid-open No. 3-39747 discloses a photo-hardening, photosensitive composition of such a material, and Japanese Patent Application Laid-open No. 3-77952 discloses a transfer recording medium employing such a photosensitive composition in the form of microcapsules.

Japanese Patent Applications Laid-open No. 6-27626, No. 6-51501 and No. 6-51502 also disclose image-forming microcapsules in which the above visible-light photosensitive material and an image-forming material such as a pigment are encapsulated.

In a dispersion in which such image-forming microcapsules are dispersed, a binder resin is added to prepare a coating composition, and this coating composition is coated on a base material such as plastic film so as to be in a stated thickness, followed by drying to form a coat layer. Thus, a photosensitive recording medium is obtained.

Since, however, those on which images are actually formed by transfer are image-receiving sheets such as plain paper when such a photosensitive recording medium is used, it has been necessary to use two kinds of consumables, the photosensitive recording medium and an image-receiving sheet. Accordingly, there have been problems that image-forming apparatus making use of these two kinds of consumables can be made compact with difficulty and require a high running cost.

SUMMARY OF THE INVENTION

The present invention was made in order to solve the above problems. Accordingly, an object of the present invention is to provide a photosensitive recording medium that enables formation of images, prefarably full-color images on the photosensitive recording medium itself, can achieve a low running cost and also can be used even in small-sized image-forming apparatus.

To achieve the above object, the present invention provides a photosensitive recording medium comprising a light-transmitting base material, and superposingly formed thereon in order i) an image-forming photosensitive layer containing photosensitive microcapsules having as materials encapsulated therein a colorant and a photosensitive material and ii) an image-receiving layer that covers up the photosensitive microcapsules and, upon release of the encapsulated materials from the photosensitive microcapsules, absorbs the encapsulated material to form an image.

This and other objects, features and advantages of the present invention are described in or will become apparent from the following detailed description of the invention.

DETAILED DESCRIPTION OF THE INVENTION

Figure 1:
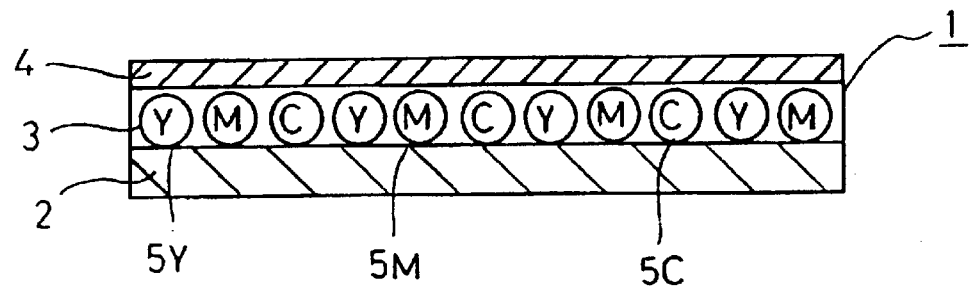
FIG. 1 is a cross section of the photosensitive recording medium according to a first embodiment of the present invention.

The present invention will be described below in detail.

The photosensitive recording medium of the present invention basically has a structure wherein, on a light-transmitting base material, a photosensitive layer containing photosensitive microcapsules is formed and, on the photosensitive layer, an image-receiving layer in which an image is formed is formed.

In the present invention, the photosensitive microcapsules contain as encapsulated materials a colorant and a photosensitive material. Here, as the photosensitive material, a substance capable of changing in structure, molecular weight or the like upon exposure to light such as visible light, infrared light or ultraviolet light may be used, and preferably a photo-hardening substance that hardens, or increases in viscosity, upon exposure to light may be used. As the colorant, dyes or pigments of various types may be used.

The image-receiving layer can cover up or hide the photosensitive microcapsules and moreover, upon release of the encapsulated materials from the photosensitive microcapsules, absorb the encapsulated material to form an image. Thus, when users view a fresh photosensitive recording medium, the colors of the photosensitive layer are visible when viewed on the base material side and the colors of the photosensitive microcapsules are invisible when viewed on the image-receiving layer side.

Visible light modulated in accordance with image information is made incident on the base material side of such a photosensitive recording medium, whereupon the photosensitive layer is exposed to light because the base material transmits the visible light. Thus, the photosensitive microcapsules contained in the photosensitive layer are exposed in accordance with the image information. Here, the photosensitive microcapsules become sensitized and hardened only by light of a specific wavelength region because of the photosensitive properties of the photosensitive material, and hence hardened portions and unhardened portions are produced in the photosensitive microcapsules in accordance with image information, thereby forming a chemical latent image. The photosensitive recording medium on which this chemical latent image has been formed is passed through a developing means such as a pair of pressure rollers, whereupon the encapsulated materials are released from unhardened microcapsules and no encapsulated materials are released from hardened microcapsules. The released encapsulated materials are absorbed by the image-receiving layer.

Since the encapsulated materials contain the colorant such as dye or pigment, the colorant is also absorbed in the image-receiving layer. Also, the image-receiving layer at its areas to which the encapsulated materials are not released has an original color (e.g., white color) of the image-receiving layer because the colorant is not absorbed. That is, image areas colored by the colorant and non-image areas having the original color such as white color of the image-receiving layer are formed as a record. Users can directly see an image, preferably a full-color image, formed in the image-receiving layer of the photosensitive recording medium itself.

In the photosensitive recording medium of the present invention, the image-receiving layer may preferably contain at least a white pigment and a binder component in order to form full-color images. In this instance, the white pigment can surely cover up or hide the photosensitive microcapsules and also, in combination with the binder, can surely absorb the encapsulated materials when the encapsulated materials are released from the photosensitive microcapsules.

In the photosensitive recording medium of the present invention, the image-receiving layer may preferably be formed in a thickness of from about 0.005 mm to about 0.03 mm, whereby it can surely cover up or hide the photosensitive microcapsules and the colorant can be kept from being buried in the image-receiving layer when the encapsulated materials are released from the photosensitive microcapsules, and hence users can view sharp images.

The photosensitive recording medium of the present invention may preferably be provided with a transparent protective layer superposingly formed on the surface of the image-receiving layer on its side opposite to the photosensitive layer.

According to the photosensitive recording medium having the transparent protective layer, images with a gloss can be obtained because users can view through the protective layer the images formed in the image-receiving layer. In addition, the images formed in the image-receiving layer can be kept from being contaminated by water or drinks or being damaged by friction. Also, the part touched by users is the base material or the protective layer, and there is no possibility of touching chemicals at all, promising a very high safety.

Such a transparent protective layer may be formed by laminating to the surface of the photosensitive recording medium a transparent plastic film similar to the base material, or by forming on the surface of the photosensitive recording medium a film of a plastic material by coating or the like means.

The photosensitive recording medium of the present invention may preferably be provided, on the surface of the base material on its side opposite to the photosensitive layer, with a pressure-sensitive adhesive layer and a release layer which are superposingly formed in this order. Thus, users may peel the release layer from the photosensitive recording medium on which images have been formed, in order to attach the latter to any articles including not only various documents but also stationery, furniture and buildings.

The present invention will be further detailed below by giving preferred embodiments and with reference to the accompanying drawings.

According to a first embodiment of the present invention, as shown in FIG. 1, a photosensitive recording medium 1 is constituted of a light-transmitting base material 2, and superposingly formed thereon a photosensitive layer 3 provided in contact with the base material 2 and an image-receiving layer 4 further provided in contact with the photosensitive layer 3.

Materials used in the base material 2 may preferably be those which can be readily made into films, have a sufficient tensile strength and can transmit visible light with ease, and may specifically include polyesters such as polyethylene terephthalate, and also polyethylene, polypropylene, acetyl cellulose, cellulose ester, polyvinyl acetal, polystyrene, polycarbonate and polyimide. In particular, films of polyethylene terephthalate or the like are especially preferred, because they have superior plane smoothness, strength and so forth and also can be made to have a thickness of as small as 0.05 mm or less and to have a relatively small volume even when brought into a roll.

Preferably to form full-color images, the photosensitive layer 3 has yellow color forming photosensitive microcapsules 5Y, magenta color forming photosensitive microcapsules 5M and cyan color forming photosensitive microcapsules 5C which are contained mixedly.

Stated in greater detail, in the yellow color forming photosensitive microcapsules 5Y, encapsulated materials comprised of a photosensitive material having a maximum sensitivity to blue light with a wavelength of about 450 nm and a yellow colorant are contained in the interiors of shells formed of a resin. Similarly, in the magenta color forming photosensitive microcapsules 5M, encapsulated materials comprised of a photosensitive material having a maximum sensitivity to green light with a wavelength of about 550 nm and a magenta colorant are contained in the interiors of shells formed of a resin. Also, in the cyan color forming photosensitive microcapsules 5C, encapsulated materials comprised of a photosensitive material having a maximum sensitivity to red light with a wavelength of about 650 nm and a cyan colorant are contained in the interiors of shells formed of a resin.

The above photosensitive materials are each comprised of at least a polymerizable material and a photopolymerization initiator. The photopolymerization initiator is a substance that generates free radicals upon absorption of light. The polymerizable material is a substance that itself undergoes chain polymerization by the action of free radicals, in other words, increases in viscosity to harden.

Stated specifically, the photopolymerization initiator may include aromatic carbonyl compounds, acetophenones, organic peroxides, diphenylhalonium salts, organic halides, 2,4,6-substituted-S-triazines, 2,4,5-triarylimidazole dimers, azo compounds, dye borate complexes, metal arene complexes and titanocene compounds, any of which may be used.

The polymerizable material may include compounds having ethylenically unsaturated groups, specifically including acrylic acid and salts thereof, acrylates, acrylamides, methacrylic acid and salts thereof, methacrylates, methacrylamides, maleic anhydrides, maleates, itaconates, styrenes, vinyl ethers, vinyl esters, N-vinyl heterocyclic rings, allyl ethers, allyl esters, and derivatives of these. In particular, among acrylates having a high polymerization rate, it is desirable to use at least one of pentaerythritol triacrylate, dipentaerythritol hexaacrylate, dipentaerythritol caprolactone adduct hexaacrylate, trimethylolpropane triacrylate and trimethylolpropane propylene oxide adduct triacrylate, which have at least three unsaturated groups acryloyl groups in the molecule.

A sensitizing dye may also be used in combination so that the photosensitivity and spectral sensitivity characteristics of the photosensitive materials can be improved. The sensitizing dye may include xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes and quinoline dyes, any of which may be used.

The colorant is dissolved or dispersed in the photosensitive material. As the colorant, dyes or pigments having been colored themselves are used. The dyes or pigments may be selected as those having suitable tinges, from among those commercially available and other known materials. In particular, preferable ones are, as yellow dyes or pigments, monoazo and disazo dyes or pigments, azo calcium lakes and azo barium lakes; as magenta dyes or pigments, quinacridones and calcium lakes; and as cyan dyes or pigments, phthalocyanines.

The microcapsules can be prepared by methods having been used as techniques known in the present industrial field. For example, such methods include, but not limited to, the method of phase separation from an aqueous solution as disclosed in U.S. Pat. Nos. 2,800,457 and 2,800,458, the interfacial polymerization method as disclosed in Japanese Patent Publications No. 38-19574, No. 42-446 and No. 42-771, the in-situ method carried out by polymerization of monomers as disclosed in Japanese Patent Publication No. 36-9168 and Japanese Patent Application Laid-open No. 51-9079, and the melt-dispersion cooling method as disclosed in British Patents No. 952,807 and No. 965,074.

Materials used to form shells of the microcapsules may be either inorganic substances or organic substances so long as the shells (walls) can be formed by the above capsule preparation methods. Materials that can well transmit light are preferred. As examples, such materials may include gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamine-formaldehyde resin, urea-formaldehyde resin, and copolymers of any of these.

The microcapsules may preferably have a particle size (diameter) as small as possible because the resolution of images is improved, but such capsules can be prepared with difficulty, resulting in a high cost. On the other hand, the larger the particle size is, the lower the resolution of images is. Accordingly, they may have a particle size of from about 0.001 mm to about 0.03 mm, and preferably from about 0.005 mm to about 0.02 mm. Also, needless to say, the less scattering the particle size has, the more preferable images can be obtained. The photosensitive layer may preferably have a thickness of from about 0.015 mm to about 0.03 mm as an average thickness.

To form the photosensitive layer, a capsule slurry is prepared by dispersing the photosensitive microcapsules in water, and then coated on the base material, followed by drying. Usually, a binder is added to the capsule slurry in order to firmly anchor the photosensitive microcapsules to the base material. The binder may be selected from the same one as the binder used to form the image-receiving layer as described later.

After the photosensitive layer 3 is thus formed on the base material 2, the image-receiving layer 4 is formed.

The image-receiving layer 4 has a function to cover up or hide the photosensitive microcapsules in the fresh photosensitive recording medium and, when images are recorded, a function to absorb the encapsulated materials (inclusive of the colorant) released from the photosensitive microcapsules in accordance with image information, to form an image. Accordingly, taking account of the contrast of images, the image-receiving layer may preferably be so made up as to be looked white when users view a fresh photosensitive recording medium from the image-receiving layer side.

Materials for and thickness of the image-receiving layer are so determined that it can well function as described above. It may preferably have a thickness of from about 0.005 mm to about 0.03 mm. If the image-receiving layer is in a thickness smaller than about 0.005 mm, it can not well hide the underlying microcapsules to cause a difficulty that the color of the colorant in the microcapsules is seen through even in an unexposed state. On the other hand, if the image-receiving layer has a thickness larger than about 0.03 mm, it can well cover up or hide the underlying microcapsules but the colorant absorbed in it may be buried in the image-receiving layer to cause a difficulty that images formed are looked whitish.

To form such an image-receiving layer 4, a image-receiving layer coating solution is prepared by mixing at least a white pigment and a binder, and the image-receiving layer coating solution obtained is coated on the surface of the photosensitive layer 3, followed by drying. The white pigment used may include, as inorganic white pigments, inorganic oxides such as silicon oxide, titanium oxide, zinc oxide, magnesium oxide and aluminum oxide, and alkaline earth metal salts such as magnesium sulfate, barium sulfate, calcium carbonate, magnesium carbonate, barium carbonate, calcium silicate, magnesium hydroxide, magnesium phosphate and magnesium hydrogenphosphate, as well as talc, kaolin, zeolite, acid clay and glass; and, as organic white pigments, polyethylene, polystyrene, acrylic resins, ionomer resins, ethylene-vinyl acetate copolymer resin, benzoguanamine resin, urea-formalin resin, melamine-formalin resin and polyamide resins. Any of these white pigments may be used alone or in combination of two or more, and are selected from those which can readily absorb the encapsulated materials of the photosensitive microcapsules.

The white pigment may preferably have a particle diameter of from 0.1 to 10 $\mu$m, and more preferably from 1 to 3 $\mu$m.

The white pigment may preferably be contained in the image-receiving layer in an amount of from 20 to 90% by weight, and more preferably from 50 to 80% by weight.

As the binder, a water-soluble polymer, a polymer latex or a polymer soluble in organic solvents may be used.

The water-soluble polymers may include, e.g., cellulose derivatives such as carboxymethyl cellulose, hydroxyethyl cellulose and methyl cellulose; proteins such as gelatin, phthalated gelatin and casein; starches such as dextrin and etherified starch; and synthetic macromolecules such as polyvinyl alcohol, polyvinyl alcohol partial acetal, poly-N-vinyl pyrrolidone, polyacrylic acid, polymethacrylic acid, polyacrylamide, polyvinyl imidazole, polyvinyl pyrazole and polystyrene sulfonic acid; as well as pullulan, gum arabic and sodium alginate.

The polymer latex may include, e.g., styrene-butadiene copolymer latex, methyl methacrylate-butadiene copolymer latex, polymer or copolymer latexes of acrylates or methacrylates, and ethylene-vinyl acetate copolymer latex.

The polymer soluble in organic solvents may include, e.g., polyester resins, polyurethane resins, polyvinylidene chloride resin and polyacrylonitrile resin.

Into the image-receiving layer, there may also be optionally incorporated an anti-hydration agent, a fluorescent brightening agent, a surfactant, an anti-foaming agent, a pH adjuster, a mildew proofing agent, an ultraviolet light absorbent, an antioxidant, a thickening agent and so forth.

An image recording process making use of the present photosensitive recording medium will be described below.

Visible light modulated in accordance with image information is made incident on the base material side of the photosensitive recording medium, whereupon the photosensitive layer 3 is exposed to light because the base material 2 transmits the visible light. Thus, the photosensitive microcapsules contained in the photosensitive layer 3 are exposed in accordance with the image information.

Here, the photosensitive microcapsules become sensitized and hardened only by light of a specific wavelength region because of the photosensitive properties of the photosensitive material, and hence hardened portions and unhardened portions are produced in the photosensitive microcapsules in accordance with image information, forming a chemical latent image.

Figure 2:
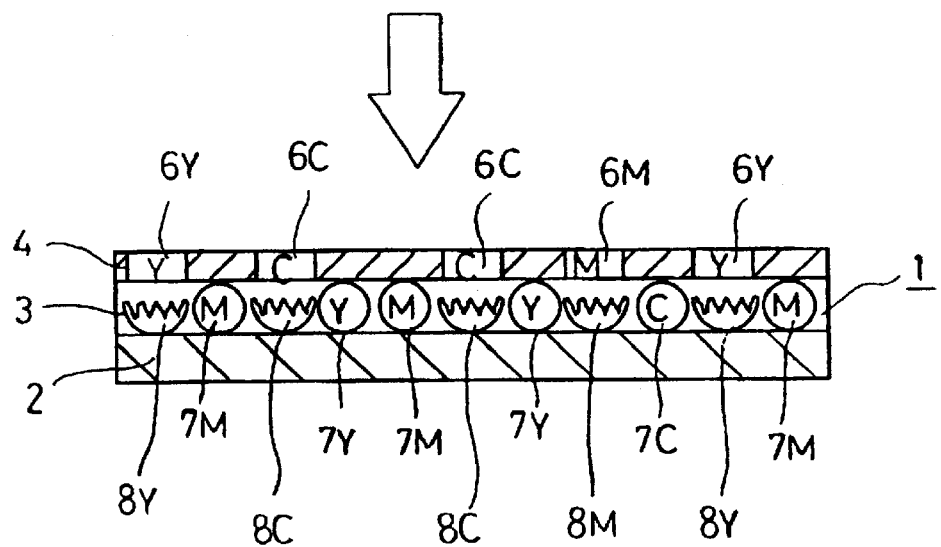
FIG. 2 is a cross section of the photosensitive recording medium according to the first embodiment on which an image has been formed.

Next, the photosensitive recording medium on which this chemical latent image has been formed is passed through a developing means such as a pair of pressure rollers. FIG. 2 illustrates such a photosensitive recording medium having been passed through the developing means. In the photosensitive recording medium 1, unhardened microcapsules 8Y, 8M and 8C in the photosensitive layer 3 are broken, whereupon encapsulated materials 6Y, 6M and 6C are released, and the encapsulated materials are not released from hardened microcapsules 7Y 7M and 7C. The released encapsulated materials 6Y, 6M and 6C are absorbed by the image-receiving layer. Since as previously described the encapsulated material 6Y contains a yellow colorant, the encapsulated material 6M a magenta colorant and the encapsulated material 6C a cyan colorant, users can see an image formed in the image-receiving layer 4, when viewed in the direction as shown by an arrow in the drawing.

Figure 3:
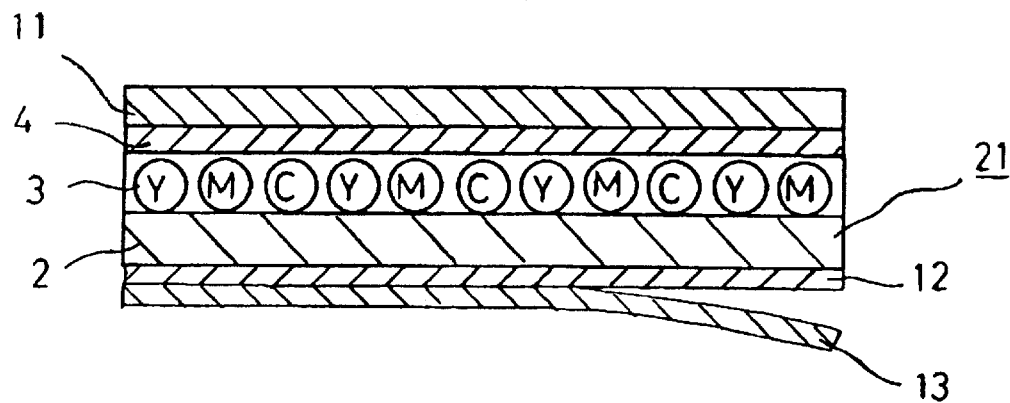
FIG. 3 is a cross section of the photosensitive recording medium according to a second embodiment of the present invention.
Figure 4:
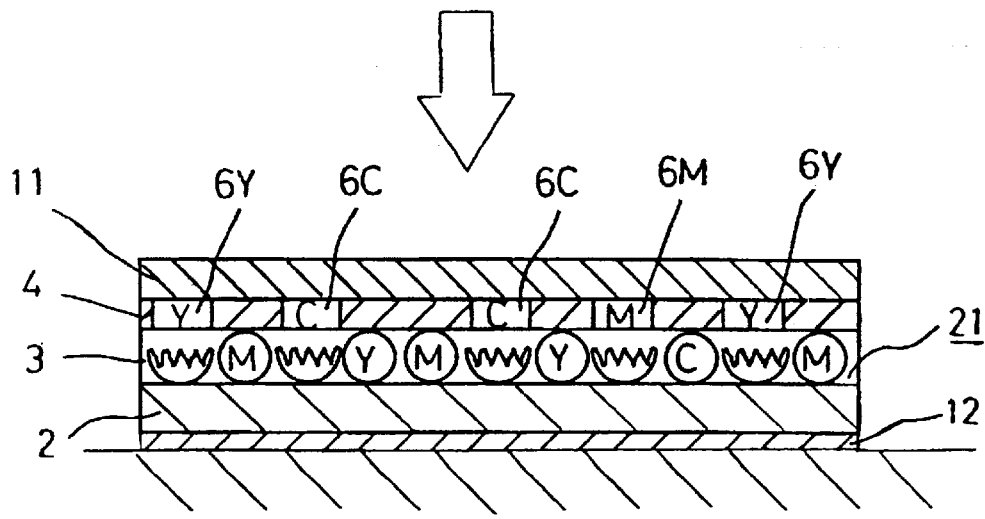
FIG. 4 is a cross section of the photosensitive recording medium according to the second embodiment on which an image has been formed.

A photosensitive recording medium 21 according to a second embodiment of the present invention will be described below with reference to FIG. 3.

The photosensitive recording medium 21 is constituted of a base material 2, and superposingly formed on the base material 2 a photosensitive layer 3, an image-receiving layer 4 and a protective layer 11, and provided on the side opposite to the photosensitive layer 3 in contact with the base material 2 a pressure-sensitive adhesive layer 12 and a release sheet 13. The base material 2, the photosensitive layer 3 and the image-receiving layer 4 are the same as those in the first embodiment, and detailed description on these are not repeated.

The protective layer 11 is provided in contact with the image-receiving layer 4, thus users see the image in the image-receiving layer through the protective layer 11. Accordingly, the protective layer 11 is required to transmit visible light. Such a protective layer 11 may be formed by laminating a film comprised of a polymeric substance including polyesters such as polyethylene terephthalate, and also polyethylene, polypropylene, acetyl cellulose, cellulose ester, polyvinyl acetal, polystyrene, polycarbonate and polyimide, or may be formed by coating an aqueous solution, aqueous emulsion or organic solvent solution containing any of these polymeric substance on the image-receiving layer 4.

The pressure-sensitive adhesive layer 12 is provided so that users can attach the photosensitive recording medium 21, on which images have been formed, to any desired objects such as paper, plastic and glass. Accordingly, this layer is so made up as to be bonded to the objects at a little pressure, e.g., by touch with fingertips, without any particular use of water or solvents. Specific materials for such a pressure-sensitive adhesive layer may include vinyl type polymeric materials such as polyvinyl chloride, polyacrylate, ethylene-vinyl acetate copolymer, ethylene-ethyl acrylate copolymer, polyvinyl acetate, polyvinyl ethers, polyvinyl acetals and polyisobutylene; fibrous polymeric materials such as ethyl cellulose, nitro cellulose and cellulose acetate; and elastomer polymeric materials such as chlorinated rubbers and natural rubbers; as well as rosins, ketone resins and phenol resins; at least one of any of which may be used.

The release sheet 13 constitutes the release layer in the present invention, and may comprise paper or a plastic film base material such as polypropylene or polyethylene terephthalate coated with a silicon resin or a polyethylene resin.

On this photosensitive recording medium 21, a color image can be recorded and formed in the same manner as the photosensitive recording medium according to the first embodiment. More specifically, encapsulated materials 6Y, 6M and 6C released from unhardened microcapsules are absorbed by the image-receiving layer 4. Since as previously described the encapsulated material 6Y contains a yellow colorant, the encapsulated material 6M a magenta colorant and the encapsulated material 6C a cyan colorant and also the protective layer 11 is transparent, users can see a full-color image formed in the image-receiving layer 4, when viewed in the direction as shown by an arrow in the drawing.

EXAMPLES

Examples in which the photosensitive recording mediums according to the embodiments described above were actually produced will be described below.

Example 1

An example in which the photosensitive recording medium according to the first embodiment described above was actually produced will be described below.

1. Preparation of C encapsulated materials:

As polymerizable materials, pentaerythritol triacrylate and dipentaerythritol hexaacrylate were weighed out in a weight ratio of 1:4 and were mixed by means of a stirrer to obtain an acrylic material. To this acrylic material, a phthalocyanine cyan pigment was added, followed by mixing, and thereafter the mixture was kneaded 10 passes by means of a three-roll mill to prepare a mill base with the pigment dispersed in the polymerizable materials. Next, to the mill base thus prepared, the above acrylic material was added, followed by uniform mixing by means of a dispersion machine to prepare a cyan pigment dispersion.

In a dark room, a wavelength sensitizing dye squarilium dye and a photopolymerization initiator ($\eta^5$-2,4-cyclopentadien-1-yl)[(1,2,3,4,5,6-$\eta$)-(1-methylethyl)benzene]iron(1+) hexafluorophosphate(1−) were added to the cyan pigment dispersion, which were then mixed and dissolved while heating at about 50° C. to obtain a composition serving as the material to be encapsulated in cyan (C) microcapsules. Formulation of the composition is as shown below.

|  | (by weight) |
|---|---|
| Acrylic materials (polymerizable compounds) | 100 parts |
| Pigment | 1 part |
| Photopolymerization initiator | 3 parts |
| Wavelength sensitizing dye | .5 part |

Hardening wave length characteristics of this composition were measured to find that it had a maximum hardening sensitivity in a visible light region of about 650 nm, i.e., the red light region.

2. Preparation of C capsule slurry:

Next, an emulsifier 1:1 aqueous solution mixture of an aqueous solution of 5% of partial sodium salt of polystyrene sulfonic acid and an aqueous solution of 5% of styrene-maleic anhydride copolymer was prepared. In 200 ml of this mixture, 100 g of the above composition was added, followed by stirring at 6,000 r.p.m. for 5 minutes by means of a homogenizer. Thus, what is called an oil-in-water (O/W) emulsion in which the above composition was present in water in a disperse state was obtained.

Separately from the above, commercially available melamine powder was added to an aqueous 37% formaldehyde solution, and the pH of the mixture obtained was adjusted to 9.0 using a sodium hydroxide solution, followed by heating at a water temperature of 60° C. for 30 minutes to obtain a melamine-formaldehyde prepolymer. The melamine-formaldehyde prepolymer was added to the O/W emulsion previously prepared, and the mixture obtained was heated so as to have a water temperature of 50° C. while stirring at 100 to 300 r.p.m. by means of an agitating homomixer. This state of heating was maintained for 5 hours, and thereafter the pH of the mixture was adjusted to 7, followed by cooling to room temperature. Thus, a cyan (C) capsule slurry in which the above composition was encapsulated therein and whose shells (walls) were formed of melamine-formaldehyde resin were obtained by the in-situ polymerization.

3. Preparation of M encapsulated materials:

The procedure for preparing the cyan (C) encapsulated materials was repeated to prepare a composition serving as the material to be encapsulated in magenta (M) microcapsules, except that the phthalocyanine cyan pigment was replaced with a quinacridone magenta pigment and as the wavelength sensitizing dye the squarilium dye was replaced with a cyanine dye, which were used in the following formulation.

|  | (by weight) |
|---|---|
| Acrylic materials (polymerizable compounds) | 100 parts |
| Pigment | 2 parts |
| Photopolymerization initiator | 4 parts |
| Wavelength sensitizing dye | 0.5 part |

Hardening wave length characteristics of this composition were measured to find that it had a maximum hardening sensitivity in a visible light region of about 550 nm, i.e., the green light region.

4. Preparation of M capsule slurry:

The subsequent procedure for preparing the cyan (C) capsule slurry was similarly taken to prepare a magenta (M) capsule slurry.

5. Preparation of Y encapsulated materials:

The procedure for preparing the cyan (C) encapsulated materials was repeated to prepare a composition serving as the material to be encapsulated in yellow (Y) microcapsules, except that the phthalocyanine cyan pigment was replaced with an azo barium lake type yellow pigment and as the wavelength sensitizing dye the squarilium dye was replaced with a coumarin dye, which were used in the following formulation.

|  | (by weight) |
|---|---|
| Acrylic materials (polymerizable compounds) | 100 parts |
| Pigment | 2 parts |
| Photopolymerization initiator | 4 parts |
| Wavelength sensitizing dye | 1 part |

Hardening wave length characteristics of this composition were measured to find that it had a maximum hardening sensitivity in a visible light region of about 450 nm, i.e., the blue light region.

6. Preparation of Y capsule slurry:

The subsequent procedure for preparing the cyan (C) capsule slurry was similarly taken to prepare a yellow (Y) capsule slurry.

7. Formation of photosensitive layer:

The cyan (C) capsule slurry, magenta (M) capsule slurry and yellow (Y) capsule slurry thus prepared were mixed in an equal proportion. To the mixed slurry obtained, an aqueous 20% polyvinyl alcohol solution as a binder was mixed in an amount of 50% by weight to prepare a coating solution. This coating solution was coated on a transparent polyester film of 0.038 mm thick by means of a comma coater. After drying, coating thickness was measured with a micrometer and found to be 0.022 mm. Thus, a photosensitive layer was formed.

8. Formation of image-receiving layer:

A coating solution for the image-receiving layer was prepared by mixing the following materials.

|  | (by weight) |
| --- | --- |
| Solvent: ethyl acetate | 100 parts |
| Pigment: EPOSTAR MS (available from Nippon Shokubai Kagaku Kogyo Co., Ltd.) | 80 parts |
| Binder: UE3300 (available from Unichika, Ltd.) | 20 parts |

Using the comma coater, the coating solution was coated on the photosensitive layer formed on the base material. After drying, the thickness of the image-receiving layer was measured, and found to be 0.015 mm.

In a darkroom laboratory, the photosensitive recording medium produced in this way was exposed for 10 seconds using a color liquid-crystal display and a 300 W xenon lamp, followed by development under application of a pressure of 300 kg/mm$^2$ by means of a pressure roller of 20 mm in diameter. At a light place, it was confirmed that a full-color image was recorded in the image-receiving layer.

Example 2

An example in which the photosensitive recording medium according to the second embodiment described above was actually produced will be described below.

The procedure of from "1. Preparation of C encapsulated materials" to "8. Formation of image-receiving layer" in Example 1 was repeated.

Next, an acrylic resin emulsion SAIBINOL EK-55 (available from Saiden Chemical Industry Co., Ltd.) was coated on the image-receiving layer. After the coating was dried at 70° C., its thickness was measured, and found to be 0.01 mm. Thus, a protective layer comprised of acrylic resin was formed.

Next, a pressure-sensitive adhesive ethylene-vinyl acetate copolymer was coated on the substrate on its side opposite to the photosensitive layer, and also a release film of polyethylene terephthalate previously coated with silicone resin was laminated thereto. Thus, a photosensitive recording medium was produced in which the protective layer was formed in contact with the image-receiving layer, the pressure-sensitive adhesive layer was formed in contact with the base material and the release layer was formed thereon.

In a dark room, this photosensitive recording medium was exposed and then developed under application of a pressure in the same manner as in Example 1. At a light place, it was confirmed through the protective layer that a glossy color image was recorded and formed in the image-receiving layer.

Water was made to fall in drops on the protective layer and thereafter wiped off, but the image was not damaged at all. Also, the release layer release film was peeled and the part of the pressure-sensitive adhesive layer was put to the surface of a plastic article, thus the image-recorded medium was firmly attached thereto.

The entire disclosure of Japanese patent Application No. 9-56214 including the specification, claims, summary and drawings is herein incorporated by reference in its entirety.

What is claimed is:

1. A photosensitive recording medium comprising a light-transmitting base material; a photosensitive layer superposingly formed on the light-transmitting base material, said photosensitive layer containing photosensitive microcapsules having as materials encapsulated therein a visible colorant and a photosensitive material; and a single-layer image-receiving layer having a thickness of 0.015 to 0.03 mm that covers up the photosensitive microcapsules and, upon release of the encapsulated materials from the photosensitive microcapsules, absorbs the encapsulated material to form an image, said image-receiving layer being superposingly formed on said photosensitive layer.

2. The photosensitive recording medium according to claim 1, wherein said photosensitive microcapsules contain yellow color-forming photosensitive microcapsules, magenta color-forming photosensitive microcapsules and cyan color-forming photosensitive microcapsules.

3. The photosensitive recording medium according to claim 2, wherein said yellow color-forming photosensitive microcapsules comprise a photosensitive material having a maximum sensitivity to blue light with a wavelength of about 450 nm, and a yellow colorant.

4. The photosensitive recording medium according to claim 2, wherein said magenta color-forming photosensitive microcapsules comprise a photosensitive material having a maximum sensitivity to green light with a wavelength of about 550 nm, and a magenta colorant.

5. The photosensitive recording medium according to claim 2, wherein said cyan color-forming photosensitive microcapsules comprise a photosensitive material having a maximum sensitivity to red light with a wavelength of about 650 nm, and a cyan colorant.

6. The photosensitive recording medium according to claim 1, wherein said photosensitive microcapsules have a particle diameter of from 0.001 mm to 0.03 mm.

7. The photosensitive recording medium according to claim 1, wherein said photosensitive layer have a layer thickness of from 0.015 mm to 0.03 mm.

8. The photosensitive recording medium according to claim 1, wherein said image-receiving layer contains at least a white pigment and a binder.

9. The photosensitive recording medium according to claim 8, wherein said white pigment is selected from the group consisting of silicon oxide, titanium oxide, zinc oxide, magnesium oxide, aluminum oxide, magnesium sulfate, barium sulfate, magnesium carbonate, barium carbonate, calcium carbonate, calcium silicate, magnesium hydroxide, magnesium phosphate, magnesium hydrogenphosphate, talc, kaolin, zeolite, acid clay, glass, polyethylene, polystyrene, acrylic resin, ionomer resin, ethylene-vinyl acetate copolymer resin, benzoguanamine resin, urea-formalin resin, melamine-formalin resin and polyamide resin.

10. The photosensitive recording medium according to claim 8, wherein said white pigment has a particle diameter of from 0.1 to 10 $\mu$m.

11. The photosensitive recording medium according to claim 8, wherein said white pigment is contained in the image-receiving layer in an amount of from 20 to 90% by weight.

12. The photosensitive recording medium according to claim 8, wherein said binder is a water-soluble polymer, a polymer latex or a polymer soluble in an organic solvent.

13. The photosensitive recording medium according to claim 12, wherein said water-soluble polymer is selected from the group consisting of carboxymethyl cellulose, hydroxyethyl cellulose, methyl cellulose, gelatin, phthalated gelatin, casein, dextrin, etherified starch, polyvinyl alcohol, polyvinyl alcohol partial acetal, poly-N-vinyl pyrrolidone, polyacrylic acid, polymethacrylic acid, polyacrylamide, polyvinyl imidazole, polyvinyl pyrazole, polystyrene sulfonic acid, pullulan, gum arabic and sodium alginate.

14. The photosensitive recording medium according to claim 12, wherein said polymer latex is styrene-butadiene copolymer latex, methyl methacrylate-butadiene copolymer latex, a polymer or copolymer latex of an acrylate or methacrylate, or ethylene-vinyl acetate copolymer latex.

15. The photosensitive recording medium according to claim 12, wherein said polymer soluble in an organic solvent is polyester resin, polyurethane resin, polyvinylidene chloride resin or polyacrylonitrile resin.

16. The photosensitive recording medium according to claim 1, wherein a transparent protective layer is further superposed on said image-receiving layer.

17. The photosensitive recording medium according to claim 16, wherein a pressure-sensitive adhesive layer and a release layer are further superposed in order, on the back of the light-transmitting base material.

18. The photosensitive recording medium according to claim 1, wherein both said image-receiving layer and said photosensitive layer are formed using a comma coater.

* * * * *